United States Patent [19]

Seidler

[11] Patent Number: 4,737,115
[45] Date of Patent: Apr. 12, 1988

[54] SOLDERABLE LEAD

[75] Inventor: Jack Seidler, Flushing, N.Y.

[73] Assignee: North American Specialties Corp., College Point, N.Y.

[21] Appl. No.: 944,456

[22] Filed: Dec. 19, 1986

[51] Int. Cl.⁴ .............................................. H01R 9/09
[52] U.S. Cl. ...................................... 439/83; 29/843; 439/876
[58] Field of Search ................. 339/17 R, 17 C, 17 L, 339/17 LC, 275 R, 275 B, 276 SF; 29/840, 842, 843, 827, 884; 206/330; 439/78-84, 876

[56] References Cited

U.S. PATENT DOCUMENTS

| | | | |
|---|---|---|---|
| 3,993,383 | 11/1976 | Marino | 339/17 L |
| 4,044,888 | 8/1977 | Schachter | 339/17 C |
| 4,367,910 | 1/1983 | Seidler | 339/275 B |
| 4,537,461 | 8/1985 | Ovellette | 339/275 B |

FOREIGN PATENT DOCUMENTS

1260145  3/1961  France .......................... 339/17 LC

Primary Examiner—Neil Abrams
Attorney, Agent, or Firm—Darby & Darby

[57] ABSTRACT

A comb-like array of electrical leads is provided, each having a solder mass and/or a locating structure at a terminal end, the array being in two sets for respective attachment to conducting areas on the top and bottom surfaces of a substrate (such as a printed circuit board), the leads being pivotable either at their stem ends (as in FIGS. 1-2, 21-22 and 31-33) or at an intermediate fulcrum (as in FIGS. 40-41). Resilient structures in the form of resilient bowed portions are formed in the leads, so that upon applying appropriate force to the resilient structures, the sets of leads are separated to accept a substrate therebetween, with the lead terminal ends aligned with respective contact pads on the substrate, and so that upon releasing such force, the leads will tend to return to their initial positions and thereby resiliently clamp the lead structure to the substrate, to be held there during subsequent soldering.

34 Claims, 9 Drawing Sheets

SOLDERABLE LEAD

BACKGROUND OF THE INVENTION

The present invention relates to providing a solderable lead construction for electrical attachment to a substrate or circuit-bearing board and more particularly to an improved solderable lead construction and method of attaching and holding such a lead construction to multiple contact pads on a substrate prior to and during the soldering of the leads to the board.

DESCRIPTION OF PRIOR ART

Heretofore leads have been applied to substrates by pushing the lead onto an edge of the substrate in the vicinity to which it is to be attached, by means of a spring clip that engages the top and bottom of the substrate to hold it in its desired location. Resilient fingers grip opposing sides of the substrate to maintain a spring tension between the lead and the substrate, with the lead in contact with a conductive area on the substrate. One or both of the fingers may hold a solder mass, to be positioned at a contact pad, to which it becomes soldered upon application of heat and subsequent cooling. Such an arrangement is shown in U.S. Pat. No. 4,592,617 of Seidler, while other solderable lead arrangements are shown in the prior art illustrated by the Seidler U.S. Pat. Nos. 4,605,278; 4,597,628; 4,597,625; and 4,433,892.

Certain difficulties and related problems have been associated with the prior art applications of leads to substrates which are overcome or avoided by the present invention. Thus, when a lead is pushed onto the substrate to resiliently grab its opposed sides, the point of contact must necessarily be located at a fixed position behind the edge of an entry point on the substrate. This results in the attachment of the lead to the substrate at a position that is substantially removed from its edge, which reduces the usable space on the substrate for the various components and the like that are to be situated thereon. This also requires that each lead be matched to the location of contact pads on each substrate. It is therefore apparent that there exists the need for a construction of leads for attachment to a substrate that uses a minimum amount of space on the edge substrate for attachment and can, if desired, be attached on either a single side or both sides of the substrate, for substrates of differing locations of contact pads. There also exists a need for a solderable lead construction that is both easy to manufacture as well as being easy to assemble with respect to multiple contact pads on the substrate to which it is to be soldered.

SUMMARY OF THE INVENTION

The present invention overcomes these and other deficiencies of the prior art by providing a lead construction and arrangement adapted for joining or soldering to a substrate carrying electrical components, comprising a comb-like configuration made of conductive resilient material such as beryllium copper, having a row of contact strips or leads which are flexurally connected at one end to a common carrier strip. The contact strips are elongated and constructed and arranged so that adjacent ones have a resilient clamp-like movement for ready assembly to the substrate to which the lead is to be attached. A first group of contact strips is arranged to move in a first direction away from their plane and alternate ones of the contact strips are arranged to move resiliently in the opposite direction from that plane, so that by pressure on the groups of strips an opening is defined at their free ends to permit the two sets of contact strips to straddle a circuit board interposed between them, after which, by relaxing such pressure, the ends of the strips are resiliently urged together to grip the circuit board between the first and second group of strips. All of the leads are arranged in parallel relation with alternative ones provided at their ends adjacent the carrier strip with a concave bend, while intermediate adjacent strips are provided with similar but opposite bends, at substantially the same location. At the free or distal end, each contact strip is formed with a terminal which is adapted to carry a solder mass, if desired. A variety of terminal end configurations is possible including configurations without solder. Adjacent strips are spaced a relative pitch between them to correspond to the spacing of contact pads located on the substrate to which the leads are to be connected or soldered when the contact leads are assembled with the substrate.

Also, by applying pressure between the oppositely facing bends, the comb of contact strips will be opened up in a scissors-like or pliers-like action, with the two sets of alternating strips moving apart to accept a circuit board. This permits ready positioning of a multiplicity of contact strips to the contact pads of a circuit board, which is then gripped by the resilient action of the opposite bends. This retains the contact strips in proper position for a simultaneous soldering action by mere application of heat sufficient to melt the solder masses held at the ends of the contact strips. The arrangement also permits the contact leads to be assembled to circuit boards having contact pads aligned at differing distances from the board edge.

The leads and carrier strip may be fabricated from a continuous roll of sheet or strip material, to be cut to individual lengths as required in conformance to the number of contact pads on the substrate to which the leads are to be attached. The number of leads in each array is correlated to the number of top and bottom contact pads on the substrate to which the leads are to be attached. The pitch or spacing for the leads will also be correlated to the spacing of the contact pads, which conventionally may be 0.1 inch.

The present invention therefore permits automated and rapid assembly of all leads for one edge of a circuit board or other substrate by simultaneously applying a plurality of leads to the substrate, in a single operation.

The construction and arrangement of the present invention has the advantage not only of permitting use of differing location of contact pads on the substrate to which the lead is to be soldered, but also being relatively easy to manufacture by customary stamping processes, and being simple to assemble simultaneously to numerous contact pads on the substrate.

Accordingly, it is an object of the present invention to provide an improved solderable lead for attachment to contact pads on a substrate such as circuit-bearing printing circuit boards and the like.

Another object of the invention is to provide an improved solderable lead for attachment to contact pads at varying locations on a substrate, including closely adjacent the substrate edges.

A further object of the present invention is to provide an improved solderable lead having a configuration and mode of operation which is easily manufactured and assembled to the substrate.

Still yet a further object of the present invention is to provide an improved solderable lead connector having a comb-like configuration including flexible lead strips which have scissor-like operation for facilitating attachment to a substrate.

These and other objects and advantages of the present invention will become apparent from the following description of preferred embodiments of the present invention when considered in conjunction with the accompanying drawings described below.

DESCRIPTION OF THE PREFERRED EMBODIMENTS

Figure 4:
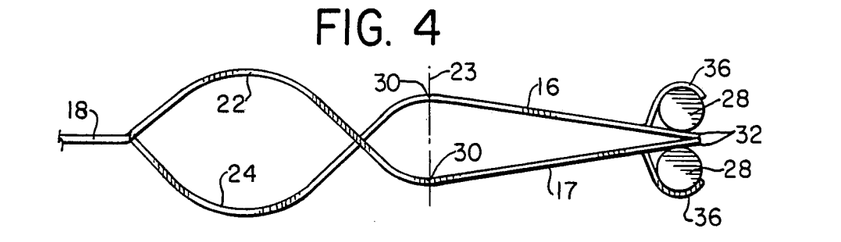
FIG. 4 is a side view of the solderable lead array of FIG. 1.
Figure 5:
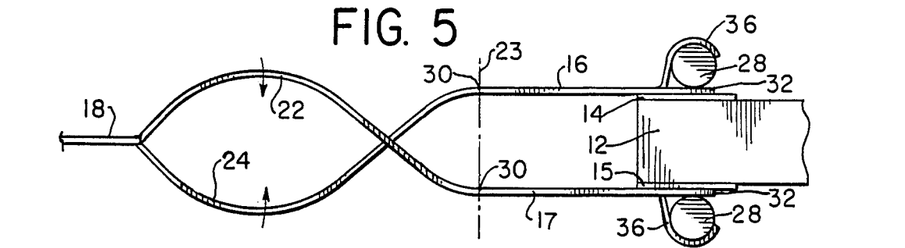
FIG. 5 is a side view of the solderable lead array of FIG. 2 attached to the substrate.
Figure 6:
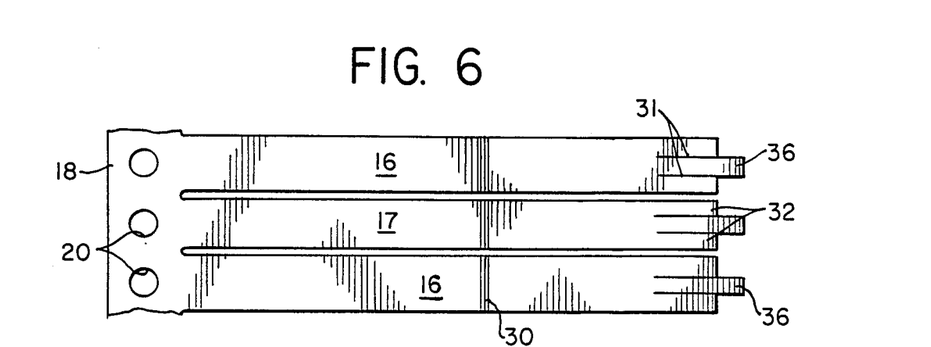
FIG. 6 is a partial top plan view of a blank for use in forming the solderable lead array of FIG. 1.

Referring now to the drawings, where like parts are designated by the same reference numeral throughout the several views, there is shown a preferred embodiment in FIGS. 1–6 comprising an electrical contact lead structure 10 which is adapted to be electrically connected to a substrate 12 carrying electrical components and including electrically conductive areas or contact pads 14. The structure is formed from a blank as shown in FIG. 6, which essentially comprises a flat sheet of conductive resilient material, such as beryllium copper, formed into a substantially comb-like configuration with a row of contact leads in the form of strips 16 flexibly carried from one end by means of a common carrier strip 18. The strips 16 are separated by slits 17, preferably formed by cutting without removal of material, permitting utilization of the maximum amount of material with less waste. The pitch of these strips 16 should be equal to one-half the pitch of the contact pads on one side of the substrate intended to cooperate with these leads which also has a plurality of sprocket holes 20 disposed along the length thereof for use in moving or indexing the structure 10. The leads 16 have an elongated configuration and are made from a flexible and resilient metal such as beryllium copper which has good electrical conductivity characteristics. At the stem end of the leads alternate ones of the contact leads 16 are bent upwardly as shown at 22 in an arcuate shape or bow relative to the general plane of the lead structure, while the intermediate leads are bent in their stem end portions downwardly as shown at 24 to provide an opposite arcuate bowed configuration relative to the plane of the lead structure.

Figure 1:
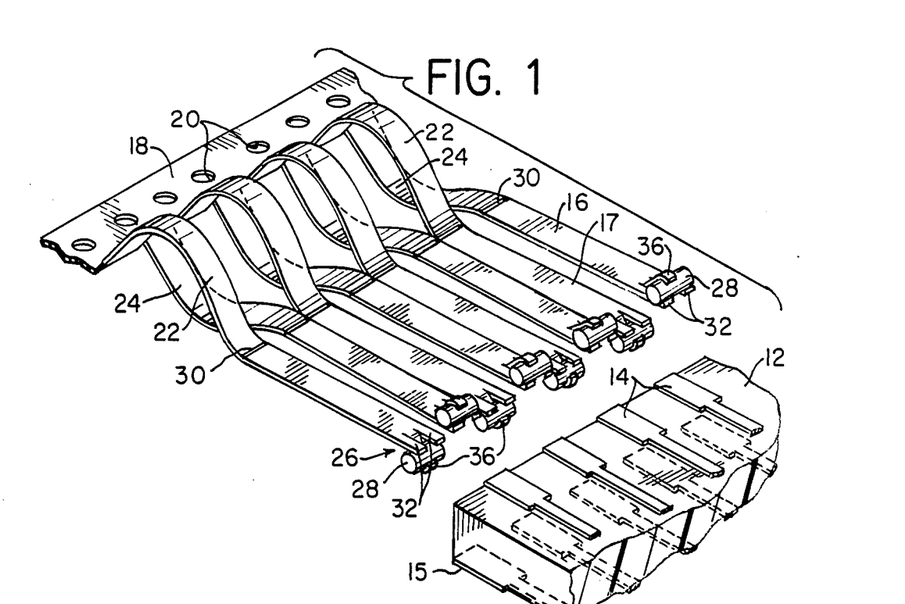
FIG. 1 is a perspective view of a solderable eletrical lead array for attachment to contact pads on a substrate, such as a printed circuit board and the like, constructed and arranged according to a preferred embodiment of the present invention, in a condition ready to be assembled to the substrate.
Figure 2:
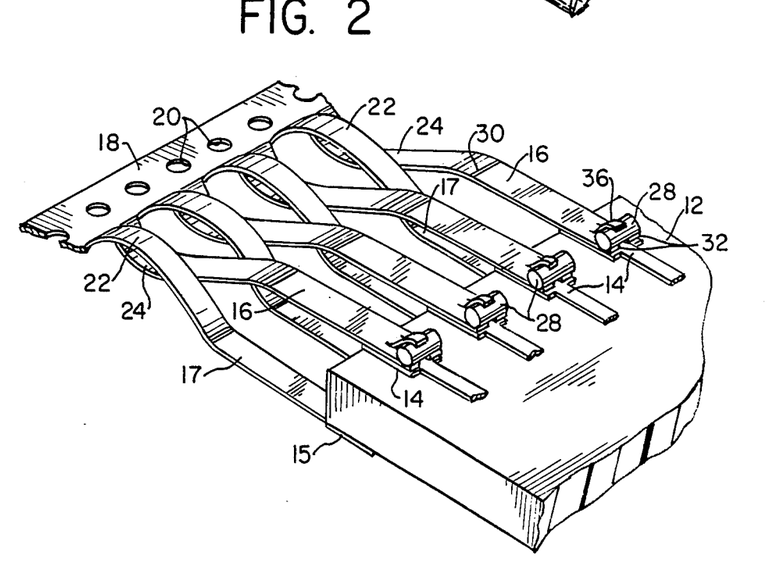
FIG. 2 is a perspective view of the lead array of FIG. 1 showing it attached to contact pads on the substrate.
Figure 3:
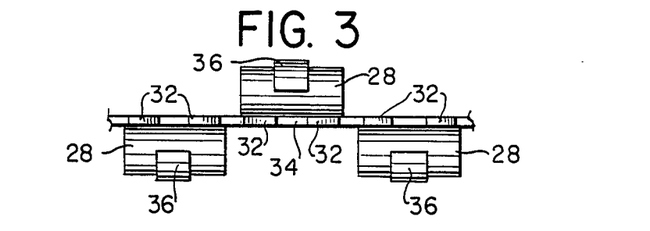
FIG. 3 is a partial end view of the solderable lead array of FIG. 1 as seen from the distal or terminal end of the leads.

At the free or distal end of each lead 16 shown in FIGS. 1-6, there is provided a distal end configuration 26 designed for carrying a solder mass 28 which upon heating with the lead in contact with a contact pad of the substrate as shown in FIG. 2, and then cooling, will electrically connect the lead with the substrate. The distal end configuration 26 of this embodiment shown in FIGS. 1-6 comprises a pair of slits 31 defining a pair of spaced tabs 32 with an intervening finger. The finger 36 is bent around a solder mass 28 to hold it between the finger 36 and the opposing flat tabs 32. The solder mass may have a width which substantially corresponds to the width of each of the strips 16 as best shown in FIG. 3 although it may be longer, if desired. As best illustrated in FIG. 6 the finger 36 extends lengthwise of the contact strip 16 beyond the termination of the flat tabs 32 to provide sufficient length to partially encompass and hold the solder mass 28.

The leads as shown are constructed and arranged to cross one another such that when the portions 22 and 24 are squeezed toward one another, an opening is created between their ends 32 so that the edge of a substrate may be interposed between those ends, as shown in FIG. 5.

The contact pads 14 on the upper face of substrate 12 are spaced apart in correspondence to the spacings of the copper set of leads 16, and the contact pads 15 on the lower face of the substrate 12 are placed intermediate the upper pads 14, and in correspondence to the spacings of the lower set of leads 17. Accordingly, when the tips 32 are separated by pressure on the bowed portions 22, 24, the substrate 12 can be interposed between these tips. When the pressure is relaxed the resiliency of the strips 16 causes the solder bearing ends to contact respective contact pads 14, 15. This causes the ends 32 to grip the substrate 12, and holds the contact comb in place for subsequent heating to melt the solder, to make good electrical contact on cooling. This arrangement facilitates using a single mechanism for applying pressure to all of the concave and convex portions 22, 24 simultaneously thereby facilitating assembly of the lead structure to the substrate. After soldering, the carrier strip 18 and bowed portions 22, 24 may be removed by severing the leads at the line 23, as by break-away notches 30.

It will be understood that the ends of the contact strips may have various configurations, either for holding solder masses or for other direct contact with circuit board contact pads.

Figures 7, 8:
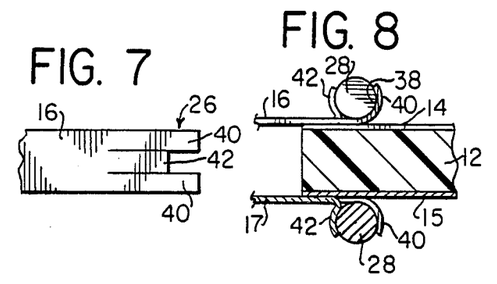
FIG. 7 is a fragmentary plan view of a modification of the terminal end of the blank of FIG. 6.
FIG. 8 is a fragmentary elevation cross-sectional view of the terminal end of FIG. 7, enclosing a solder mass and assembled to a circuit board.

FIGS. 7 and 8 show another distal end configuration for each of the lead strips 16. Here, the blank shown in FIG. 7 has the finger 42 shorter than the side tabs 40. As seen in FIG. 8, both the finger 44 and the tabs 40 are bent around the solder mass 28. The tabs 40 are bent in a curved fashion away from the plane of the lead strip 16 to form a first side of a channel 38 for the solder mass 28 and the finger 42 is also bent in a curved fashion opposite to that of tabs 40 to define the other side of the arcuate channel 38. The finger 42 and tabs 40 may encircle the solder mass by more than 180 degrees or one or the other may be crimped into the solder mass, to hold it in place. Here again (as in all of the solder holding arrangements) the solder mass preferably is as long as or longer than the width of the contact strip 16 on which it rests.

Figure 9:
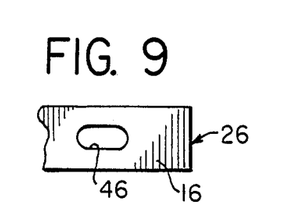
FIG. 9 is a fragmentary plan view of another modification of the blank for the terminal end.
Figure 10:
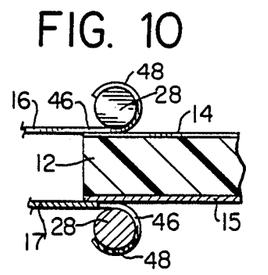
FIG. 10 is a fragmentary elevation cross-sectional view of the blank of FIG. 9 formed to enclose a solder mass and assembled to a circuit board.

FIGS. 9 and 10 show another embodiment of the distal end configuration. Here the blank 26 (FIG. 9) has a slot 46 formed in it. As seen in FIG. 10, the end 48 is bent and/or crimped around the solder mass 28 to hold it in place. The slot 46 is between the solder mass 28 and the contact pad 14 to allow the solder (when molten) to flow (or be drawn by capillary action) into the space between the contact lead 16 and the contact pad 14, to make a good electrical connection when resolidified.

Figure 11:
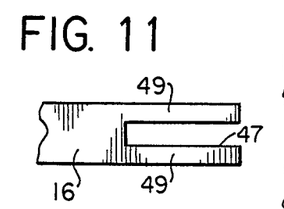
FIGS. 11–12 show views similar to FIGS. 9–10 for a different distal end configuration for a solderable lead according to the present invention.
Figure 12:
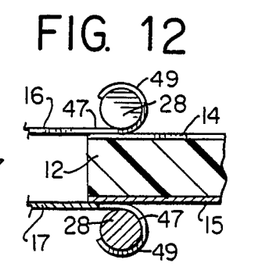

FIGS. 11 and 12 show a further embodiment of a distal end configuration, similar to the one shown in FIGS. 9 and 10, except that the slot 46 is extended to the end of the contact strip 16, to form two elongated tabs 49 which are bent to substantially encompass the major portion of the periphery of the solder mass 28.

Figure 13:
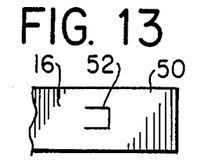
FIGS. 13–14 show similar views of a blank and another distal end configuration for a solderable lead according to the present invention.
Figure 14:
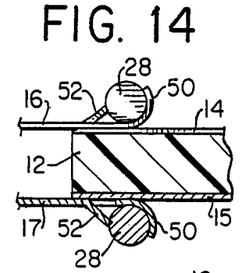

FIGS. 13 and 14 show a lead having a distal end configuration where a tab 52 is cut out and bent upwardly from contact strip 16. The extreme end 50 of the lead strip 16 is bent to form a cradle partially around the solder mass 28. Tab 52 is bent into the solder mass 28 on the side opposite from the strip end 50 to hold the solder mass 28 in place on the lead structure. The opening from which the tab 52 is cut permits the molten solder to flow between contact strip 16 and contact pad 14, as is desirable.

Figure 15:
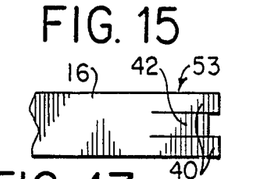
FIGS. 15 and 16 show similar views for yet another distal end configuration for a solderable lead according to the present invention.
Figure 16:
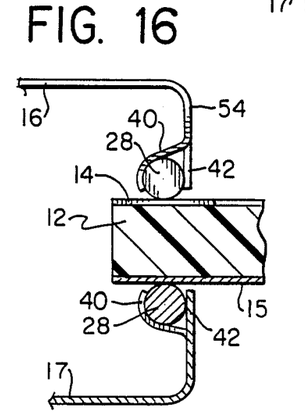

In the embodiment of FIGS. 15 and 16, the end 53 of each of the lead 16 is shown as having a distal or terminal contact configuration similar to that of the embodiment of FIGS. 7 and 8. However, the free end portion 54 of each of the leads is bent at a right angle relative to the lead strip 16 such that the lead extends perpendicularly to the substrate and the solder mass can be disposed in direct contact with the substrate contact pad to which the lead is to be secured. This arrangement is particularly useful for leads for surface-mounted components.

Figure 17:
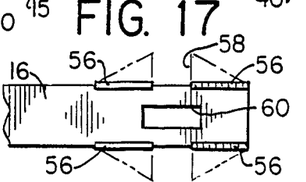
FIGS. 17 and 18 show similar views for still another distal end configuration for a solderable lead according to the present invention.
Figure 18:
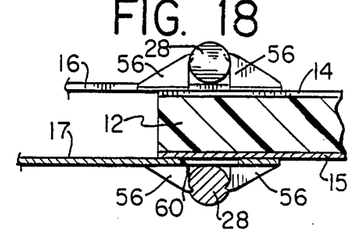

In the embodiment of FIGS. 17 and 18, the solder mass is held in place by a distal end configuration similar to that disclosed in the Seidler U.S. Pat. No. 4,605,278. In this arrangement, a pair of tabs 56 disposed on each side of the strip 16 are bent upwardly to define a gap 58 which forms a channel extending transversely across the width of the strip 16 between its lateral edges. The solder mass 28 is disposed in this channel and is held by bending the tabs 58 to hold the solder. A slotted opening 60 in strip 16 disposed in alignment with the main axis of the lead may be provided such that when the solder mass is melted it flows through the opening 60 to making good electrical contact between the lead and the contact pad underlying the lead. If desired, the end configurations shown in FIG. 18 may be interchanged, with the one shown on top of the substrate being placed at the bottom and vice-versa.

Figure 19:
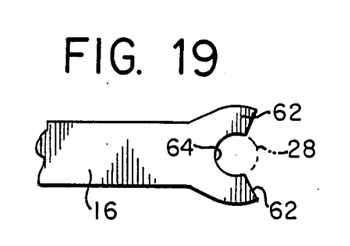
FIGS. 19 and 20 show similar views for a further distal end configuration for a solderable lead according to the present invention.
Figure 20:
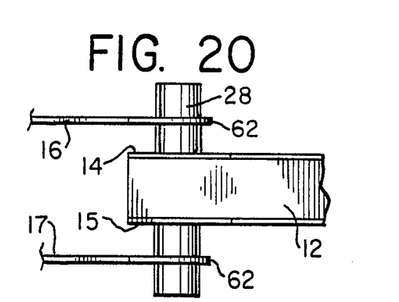

Another embodiment is shown in FIGS. 19 and 20 in which the end of the lead 16 is bifurcated, with two arms 62 which retain the solder mass 28 crimped between them. In this instance, the solder mass (usually in the form of a short section of solder wire) extends perpendicularly to the plan of contact lead 16, and as shown in FIG. 20 is positioned directly in contact with the contact pads 14 or 15.

Figure 21:
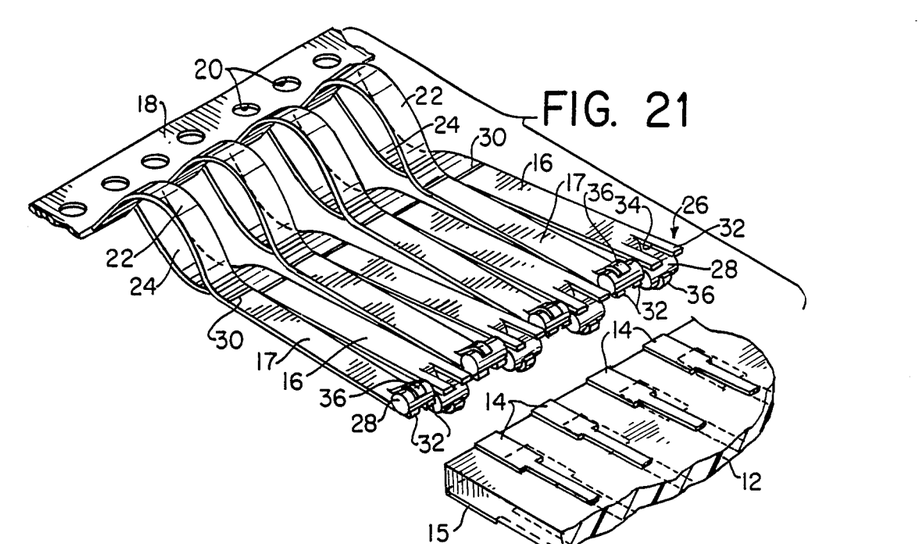
FIGS. 21 to 23 show perspective views and a side view, similar to FIGS. 1–3, of an embodiment of a solderable lead array constructed according to the present invention having still another form of distal end.
Figure 22:
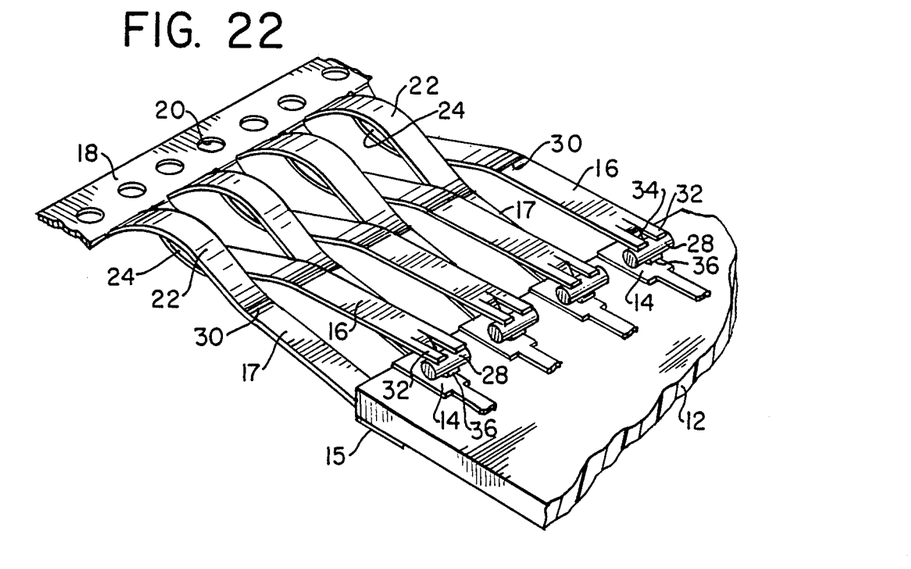
Figure 23:
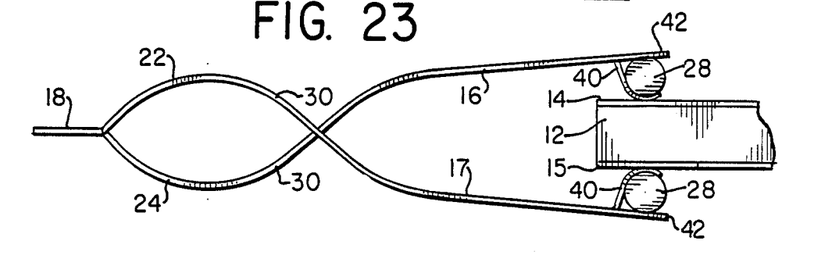

Another embodiment is shown in FIGS. 21 to 23, which utilizes the blanks of FIG. 6. In this version, at the terminal end of each lead, the configuration for holding the solder mass in plane comprises a pair of spaced tabs 32 essentially in the plane of the contact lead 16. A curved finger 36 cut out from the end of contact lead 36 substantially surrounds the solder mass and holds it in place at the terminal end of the lead. In this instance, the finger 36 of each lead end is juxtaposed to the contact pad 14 or 15, in contrast to FIG. 2 where the tabs 32 are positioned against the contact pads.

As in FIGS. 1-2, the terminal end of each lead is constructed and arranged so that when pressure is applied between the bowed portions of the leads near the stem end, the distal ends separate to accommodate the substrate to be soldered, and upon release of the pressure the curved finger 36 will be disposed in contact with a respective contact pad as best illustrated in FIG. 22.

Figure 24:
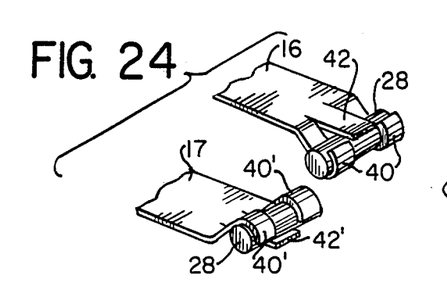
FIG. 24 shows a perspective view of enlargements of the distal end of a variation of the configuration, showing both the upper and lower lead ends.
Figure 25:
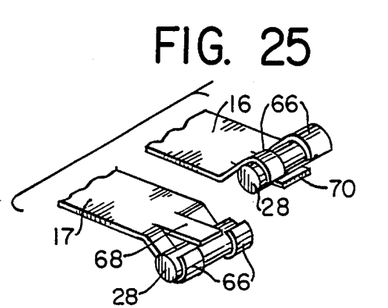
FIG. 25 shows similar views of another embodiment of the upper and lower distal end configuration.

FIG. 24 shows another variation of terminal end for contact strip 16, utilizing the blank of FIG. 7. Here, for the upper contact lead, the solder mass is held against center tab 42 by a pair of spaced, bent, curved tabs 40 which define an opening 68 disposed between them. On the opposing side for the lower contact lead, the solder mass 28 is held similarly, but in upside-down relation between flat central tab 42' and the pair of curved fingers 40'. In the arrangement of FIG. 24 when the leads are disposed in contact with the substrate contact pads, the curved fingers 66 will be disposed in contact with the substrate. FIG. 25 shows a variation similar to FIG. 24, but with the upper and lower lead ends interchanged, so that the flat tab 42 is disposed in direct contact with the contact pad 14 or 15.

Figure 26:
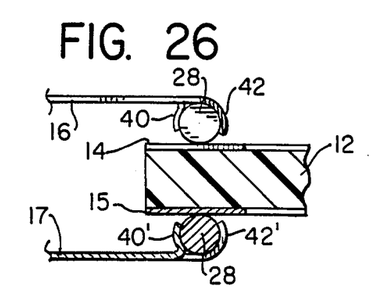
FIG. 26 shows a fragmentary side elevation cross-sectional view of a further embodiment of a distal end configuration, carrying a solder mass in a curved channel for direct contact with the substrate to which the lead array is to be soldered.
Figure 27:
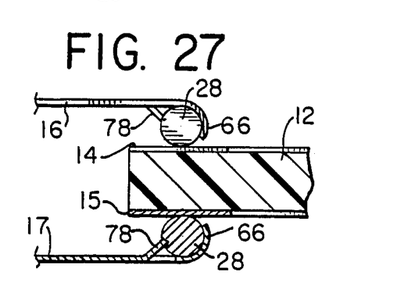
FIG. 27 shows a fragmentary side elevation cross-sectional view of still yet another distal end configuration, with the solder mass held in place by an extreme curved end portion bent to conform with the solder mass shape and an upwardly bent angular tab adapted to engage the opposing side of the solder mass.

FIG. 26 illustrates a contact end configuration which is like FIG. 8, but with each end turned over, so that the channel 72 carrying the solder mass 28 is disposed in direct contact with the substrate to which it is to be soldered. The solder mass is held between curved outside tabs 74 and a further curved center tab 76. The embodiment of FIG. 27 has a configuration like FIGS. 13 and 14, but with each end turned over, so that the solder mass 28, when assembled with the substrate is in direct contact with the respective contact pad.

Figure 28:
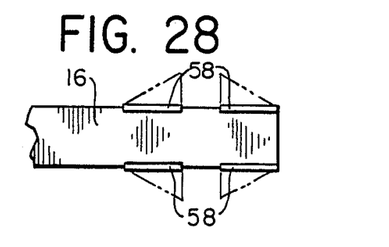
FIGS. 28 and 29 show a fragmentary plan view and side elevation cross-section of another distal end configuration with sloping tabs bent relative to the plane of the lead such that the solder mass is held in direct contact with the substrate.
Figure 29:
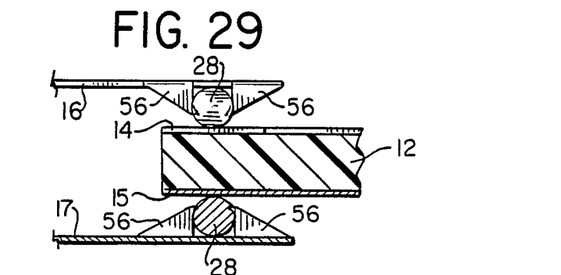

Similarly, the lead end of FIGS. 28 and 29 corresponds to that of FIGS. 17 and 18, but turned over so that each solder mass is assembled in direct contact with its contact pad, being urged toward the contact pad by the resilience of bowed portion 22, 24.

In this embodiment no opening in the main lead directly below the solder since the solder (such as 60 of FIG. 17) need be provided, since the solder mass is now disposed for direct electrical contact with the contact pad, thereby improving the manufacturing process.

Figure 30:
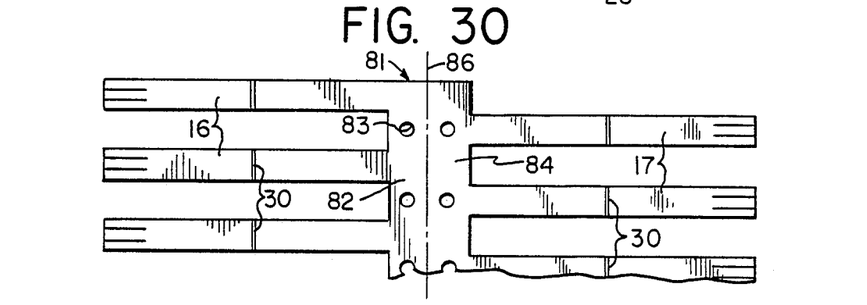
FIG. 30 is a top plan view of a blank of a comb-like array of leads for another embodiment of the invention.
Figure 31:
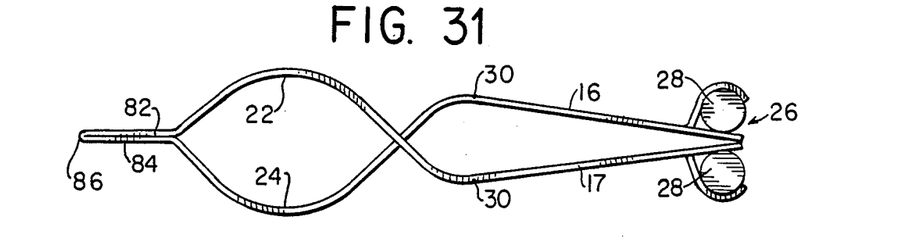
FIGS. 31 and 32 show side elevation view of a modified lead array according to the present invention using a blank similar to that of FIG. 30 and with a distal end configuration similar to that of FIG. 1.
Figure 32:
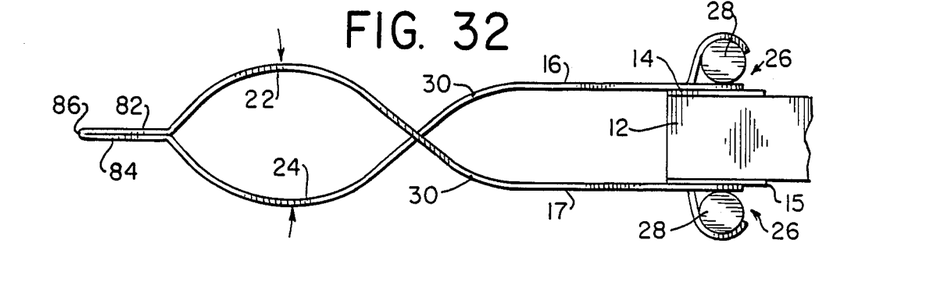

FIGS. 30-32 show an alternative way of providing the comb arrangement of leads of the present invention, which provides advantages in manufacture, at the cost of increased waste of material. In the embodiment illustrated in FIG. 30-32, the lead structure is made from a flat piece of sheet metal illustrated in FIG. 30, which comprises a left half 82 from which a first set of the leads are formed (such as for above the substrate) and a second contiguous right half 84 from which the other alternate leads are formed (such as for below the substrate). The two sets of lead blanks 82 and 84 are joined by and integral with a central section 82, which may have one or more sets of sprocket holes 83 for indexing the sheet during manufacture. To form the comb-like lead structure of the present invention, one of the halves 84 is folded along the central fold line 86 such that the leads 16 in the half 82 will be located between adjacent leads 16' formed in the other half 84.

The sprocket holes 83 may overly one another, to form a single set for use in automated assembly of the present invention to circuit boards.

The structure shown in FIGS. 31 and 32 has the solder-bearing lead terminals of FIGS. 1-5. It will be understood that any desired terminal structure may be substituted, including that of any of FIGS. 7 to 29.

Figure 33:
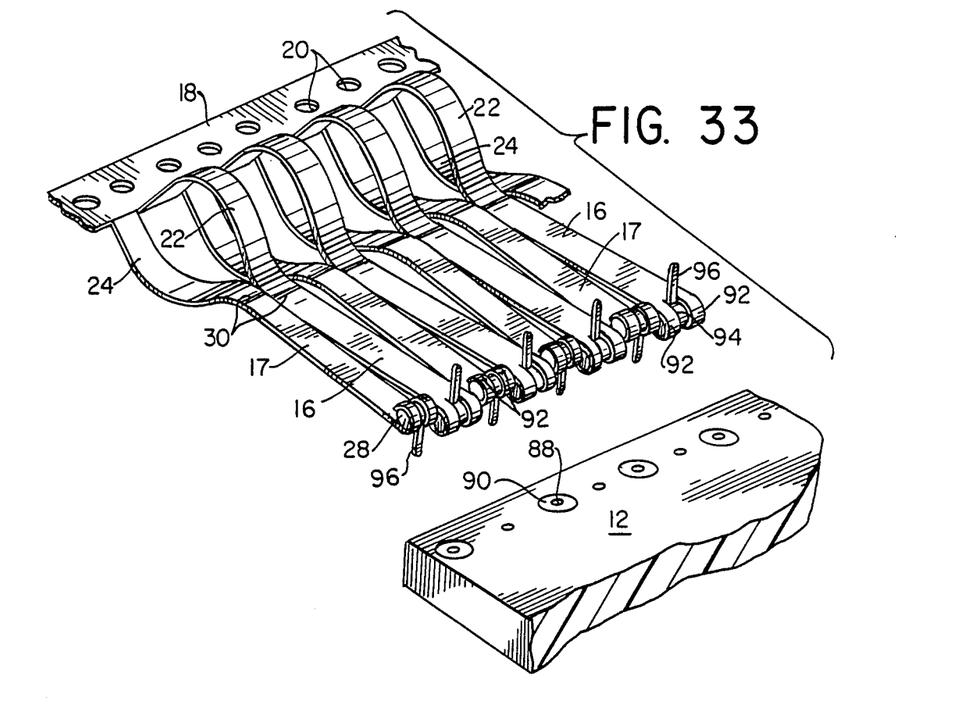
FIG. 33 is a perspective view of another embodiment of the present invention, with a distal end configuration that carries a solder mass and a protruding perpendicular finger adapted for engagement with through holes provided in the substrate to which the lead array is to be attached.
Figure 34:
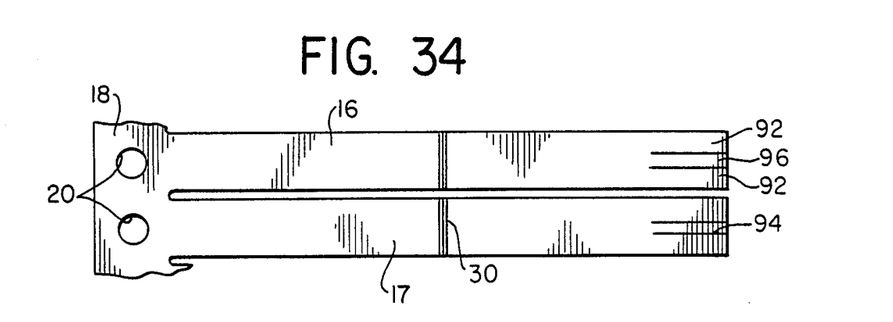
FIG. 34 shows a partial top plan view of a lead array useful in the embodiment of FIG. 33.
Figure 35:
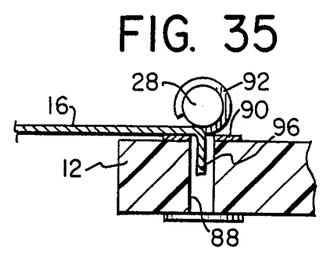
FIGS. 35 through 38 show various embodiments of lead constructions according to the present invention with different distal end configurations that are designed to engage with through holes formed in the substrate to which the lead array is to be attached.

The embodiment of FIGS. 33 through 35 provides a construction and arrangement similar to the other embodiments, adapted for improved mating of the lead structure with the substrate. This version is designed for attachment with a substrate 12 which, instead of or in addition to contact pads, is provided with contact through-holes or openings 88 which are disposed along the edge of the substrate, each adapted for attachment with a corresponding lead. Each through-hole 88 may be lined with conductive material and is optionally provided with a flat contact pad 90 on the side of the substrate to which the electrical connection is to be made. The terminal end of each lead 16 has a configuration which includes a protruding prong 96, formed as an extension of the end of lead strip 16, the prong 96 being disposed in substantially perpendicular relation to the main plane or body of each of the leads 16. The lead structure may be formed from a blank in the form shown in FIG. 34, where the lead strips 16 are joined to the carrier strip 18 as in FIG. 1. The end of each lead strip 16 is formed into a center finger and side fingers 92. The center finger becomes prong 96 when bent at a right angle to lead strip 16. The direction of the prong 96 is such that when the lead structure is assembled with the substrate, each of the protruding prongs 96 is engaged in a corresponding one of the through-holes 88, as best illustrated in FIG. 35. This aids in properly aligning each lead end with its respective contact pad. The resilient scissor-like action of the lead structure causes the structure to be resiliently held on the substrate, until a subsequent soldering action, which may be by conventional wave-soldering or dip-soldering.

Alternatively, in addition to prong 96, each lead end is provided with a solder-retaining configuration, which holds a solder mass adjacent the base of prong 96. As shown in FIGS. 33 and 34, this may be formed by the outer pair of fingers 92, which are bent around solder mass 28 to hold it in place adjacent the base of prong 96. The space 94 between curved fingers 92 permits ready solder flow to the contact pad. Thus, when heat is applied to assembly of lead structure and substrate, the molten solder will flow both between lead 16 and the contact pad, and also into the substrate hole 88, to provide electrical contact between the lead and the contact pad surrounding the through-hole 88, as well as between prong 96 and the wall of the hole 88.

Figure 36:
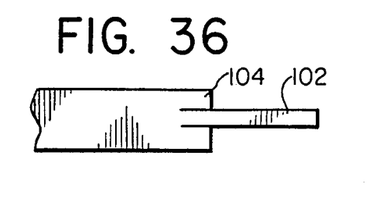
Figure 37:
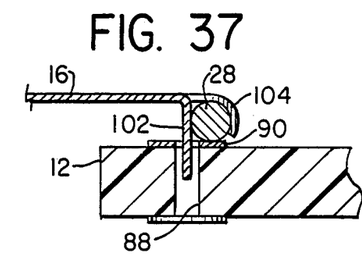

FIGS. 36 and 37 show an alternative in which the solder mass 28 is held between an elongated finger 102 (whose end forms a prong to mate with the circuit board hole 88) and the side tabs 104.

Figure 38:
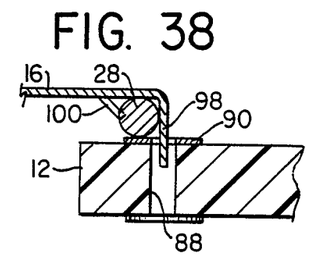

FIG. 38 illustrates another contact end configuration where the hole-engaging prong 98 is formed at the extreme end of the lead, and is bent at a right angle relative to the main plane or body of the lead 16, so that the prong 98 engages the substrate when the lead is assembled to the substrate. The prong 98 provides a flat surface support on one side for the solder mass 28 and on the other side the solder mass 28 is supported by a sloping outwardly bent tab 100 which contacts the opposing surface of the solder mass 28 and maintains it in position at the terminal end of the lead.

Figure 39:
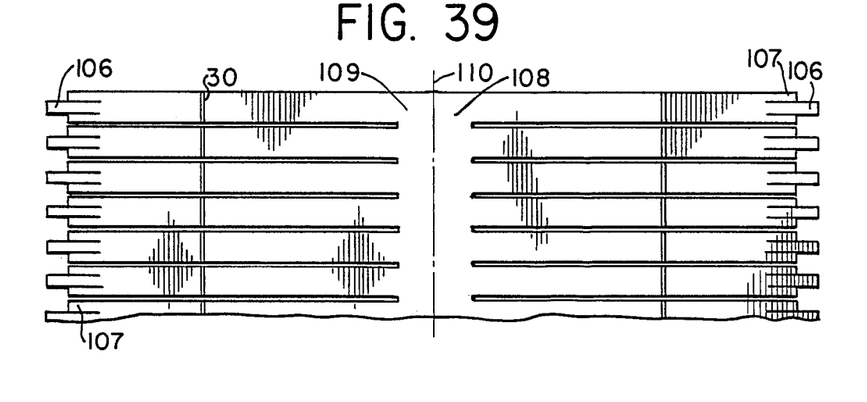
FIG. 39 shows a fragmentary plan view of a blank useful in making the lead array of FIGS. 40 and 41.

The embodiment in FIG. 39 illustrates the end of the lead as being bent at right angles such that, when the leads are assembled with the substrate, the end portions 106 will align themselves with the corresponding through-holes and will securely hold the lead structure to the substrate. The embodiment of FIG. 39 is shown without any solder mass, since it is not necessary within the scope of the invention to have the solder mass carried by the lead structure; the lead structure can be attached to the substrate by other suitable means such as by applying the solder to the lead and substrate after the lead has been attached in the manner shown in FIG. 39.

Figure 40:
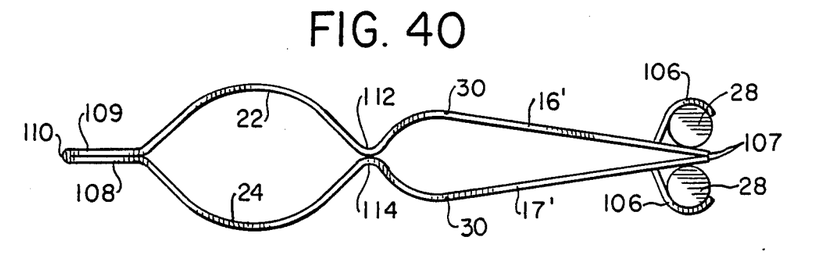
FIGS. 40 and 41 show a modified version of the present lead construction, similar to FIGS. 1 and 2, with opposed leads having a fulcrum for permitting opening of the distal ends of the lead array to receive a substrate to which the leads are to be soldered.
Figure 41:
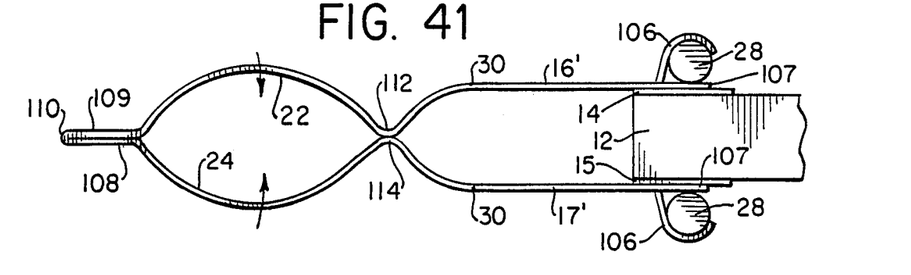
Figure 42:
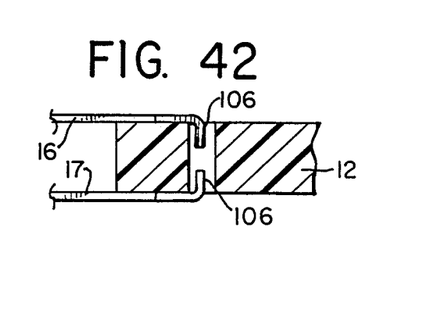
FIG. 42 is a fragmentary side elevation cross-section of the ends of a lead array similar to FIGS. 40–41, as assembled in a circuit board, before soldering.

The further embodiment illustrated in FIGS. 40-42 shows a lead structure according to the present invention which is also formed from a single continuous sheet or wide strip 108 of metal having resilient characteristics and good electrical conductivity. As FIG. 42 illustrates, the leads are formed on each of the two halves of the sheet 108 with the leads on one side aligned with those on the other side of the sheet 108. Each lead on one side of sheet 108 has a resilient bowed portion 22, and a reverse bend 112. The corresponding lead on the other side of sheet 108 has a similar resilient bowed portion 24 and a reverse bend 114. The sheet 108 is folded on itself, at or in the vicinity of line 110, so that the corresponding bends 112, 114 are in contact, with the bowed portions 22, 24 opposed to one another. The bends 112, 114 form a fulcrum or pivot, as shown in FIGS. 40 and 41. This fulcrum arrangement enables the lead ends to be separated to a desired spacing by squeezing the bowed portions 22, 24 together, which pivots the leads 16 at the fulcrums 112, 114 to separate the lead ends, permitting insertion of the substrate to which the leads are to be attached. Since the lead pairs are aligned in overlying relationship, the substrate to which the leads are to be attached will have contact pads that are similarly aligned above and below the substrate, instead of being offset or interleaved as illustrated in the earlier embodiments of the present invention. In this latter embodiment, pressure may be exerted on the leads in the pressure areas, which is translated to the fulcrum point for each pair of overlying leads to cause the opposed ends of the leads to open to the desired spacing, correlated to the size of the substrate. As in the case of the previously described embodiment with scissor-like operation, the present lead structure permits opening of all of the lead pairs simultaneously and placement of the substrate for attachment with the leads in essentially a single manipulation.

While the embodiment of FIGS. 40-42 has been illustrated as having solder-bearing lead ends with the configuration of FIGS. 1-5, it will be understood that any solder-bearing lead ends, such as those described above, may be used in this embodiment, or any other embodiment of the comb-like structure.

While most of the embodiments have been described above as having a solder mass at the terminal end of the lead, that is not essential. It is within the contemplation of the present invention for solder to be applied separately, as by a wave-soldering or dip-soldering technique, after the lead has been attached with the particular substrate to which it is to be connected. Thus, by way of illustration, FIG. 42 shows the lead end portions of the configurations of FIGS. 40-41, with the solder mass omitted. Here, the prongs 106 are bent inwardly to engage the substrate hole 88 from both sides. The resiliency of the bowed portions 22, 24 will retain the contact configurations attached to the substrate through subsequent soldering operations, which may be of conventional type.

Also, in any of the forms shown in FIGS. 35 to 38, the solder mass may be omitted. The prong 96, 98 or 102 will serve to hold the comb-like lead structure on the substrate during subsequent soldering.

After soldering is completed, the carrier strip and bowed portions are removed, as by severing along line 23 of FIG. 4 or FIG. 5 or a corresponding position in the other embodiments. The lead strips may be scored as at 30 to facilitate such severing. This leaves the leads 16 electrically and mechanically connected to the substrate at its contact pads, for use in connecting to other circuit components. In some cases these leads may serve as a multi-pin connection, directly mating with a corresponding multiple receptacle.

In each instance, the lead terminal end is urged toward its contact pad by the resilience of the spring bows 22, 24.

Thus, it will be seen that the present invention provides a comb-like array of leads, each having a solder mass and/or a locating structure at a terminal end, the array being in two sets for respective attachment to conducting areas on the top and bottom surfaces of a substrate, the leads being pivotable either at their stem end (as in FIGS. 1-2, 21-22 and 31-33) or at an intermediate fulcrum (as in FIGS. 40-41). Resilient structures in the form of resilient bowed portions are formed in the leads, so that upon applying appropriate force to the resilient structures, the sets of leads are separated to accept a substrate (e.g., a printed circuit board) therebetween, with the lead terminal ends aligned with respective contact pads on the substrate, and so that upon releasing such force, the leads will tend to return to their initial positions and thereby resiliently clamp the lead structure to the substrate, to be held there during subsequent soldering.

It should be understood that the present invention is subject to many variations, modifications and changes in detail. However, it is intended that all matter contained in the foregoing description or shown in the accompanying drawings shall be interpreted as illustrative only and not in a limiting sense, the scope of the invention being defined by the appended claims.

What is claimed as the invention is:

1. A lead structure adapted to be attached to a substrate having two surfaces with an array of conductive areas along at least one surface thereof, comprising a main body of conductive material having a substantially comb-like configuration, said main body including an array of elongated leads, each having a stem end and a free terminal end, with a carrier strip connected to said leads at their stem ends, said leads being in two sets, one set being adapted for cooperation with the conductive areas along one substrate surface, said leads being constructed and arranged such that the terminal ends of the leads in said one set are adapted to be moved together in a first direction independently of association with said substrate and the terminal ends of the leads in the other set are adapted to be moved together in an opposite direction independent of association with the substrate and simultaneously with movement of said one set, thereby to define a spacing between the terminal ends of the respect sets of leads, which spacing is at least as large as the thickness of the edge of said substrate, permitting insertion of said substrate between said sets of leads to cause said one set of terminal leads to be juxtaposed to said conductive areas on said one substrate surface with the other set of terminal leads juxtaposed to another substrate surface.

2. A lead structure as in claim 1, said leads being resilient and adapted to resiliently grip said substrate between said two sets of leads.

3. A lead structure as in claim 1, said one set of leads having a spacing corresponding to the spacing of said conductive areas to permit said one set of leads to be juxtaposed to respective ones of said conductive areas.

4. A lead structure as in claim 1 wherein each of said one set of terminal ends holds a solder mass.

5. A lead structure as in claim 1 wherein each of said one set of terminal leads has a projection adapted to cooperate with a corresponding opening in said substrate for positioning said terminal end relative to said substrate.

6. A lead structure as in claim 1 the leads of one set being in interleaved relation to the leads of the other set.

7. A lead structure as in claim 1 wherein the leads of one set are opposite and juxtaposed to respective leads of the other set.

8. A lead structure as in claim 1 further including a carrier strip forming part of said main body and integral therewith, interconnecting all of said leads.

9. A lead structure as in claim 8 further including said structure being arranged to permit removal of said carrier strips after assembly of said leads to a substrate.

10. A method of assembling a lead structure as in claim 1 with a substrate having conductive areas, comprising the steps of:
(a) causing said free terminal ends of a first plurality of said leads to move simultaneously in a first direction relative to the general plane of said structure;
(b) causing the free terminal ends of a second plurality of said leads to move simultaneously in an opposite direction relative to said first plurality of leads and relative to the general plane of said lead structure, whereby a spacing of predetermined size correlated to the thickness of said substrate is created between the free terminal ends of said first and second plurality of leads;
(c) thereafter inserting said substrate within said spacing defined between said free terminal ends of said first and second plurality of leads;
(d) and causing each of said free terminal ends to contact said substrate in a respective predetermined location.

11. The method of assembling a lead structure to a substrate according to claim 10 including the step of causing said free terminal ends of said first and second plurality of leads to be disposed in electrical contact with conductive areas on said substrate.

12. The method of assembling a solderable lead structure to a substrate according to claim 10 further including the steps of
(a) providing a solderable mass at at least some of said free terminal ends of said first and second plurality of leads prior to attachment of said lead structure to said substrate,
(b) simultaneously heating said solder masses to cause the solder to flow into contact with said conductive areas, and
(c) allowing said solder to solidify to join each lead to a respective conductive area of the substrate.

13. A solderable lead structure adapted to be attached to a substrate having an array of conductive areas on a top surface thereof and an array of conductive areas on a bottom surface, comprising
a main body of conductive material having a substantially comb-like configuration comprising a row of substantially parallel elongated leads, each having a stem end and a free terminal end, and a common carrying strip connected to said leads at their stem ends;
said leads being in two sets, one set being adapted for cooperation with said top surface conductive areas and the other set being adapted for cooperation with said bottom surface conductive areas, with each lead of one set being adjacent a respective lead of the other set;
said leads being constructed and arranged such that the terminal ends of leads in said first set may be moved together in a first direction, independently of said substrate, and the terminal ends of leads in said second set may be moved together in an opposite direction independently of said substrate simultaneously with movement of the leads of said first set, thereby to define a spacing between the terminal ends of the respective sets of leads, which spacing is at least as large as the thickness of the edge of a substrate with which the lead structure is to be attached, and permitting insertion of said substrate between said sets of leads, with each said lead juxtaposed to a respective conductive area on both said top and bottom substrate surfaces.

14. A structure as in claim 13 wherein said sets of leads are resiliently urged toward one another upon being separated.

15. A structure as in claim 13 wherein each lead has a resilient bowed configuration adjacent said carrying strip.

16. A structure as in claim 15 wherein the bowed configuration of one set of leads is bowed oppositely to that of the other set.

17. A solderable lead structure as in claim 13 wherein at least some of said lead terminal ends have a solder mass attached thereto adapted to be placed in contact with a respective conductive area.

18. A structure as in claim 13 wherein at least some of said lead terminal ends have a structure adapted to align an end with a respective position on said substrate.

19. A lead structure according to claim 16 wherein each of said bowed configurations provides a pressure-applying area for its lead, permitting simultaneous separation of said lead sets upon applying opposed forces to said pressure areas.

20. A lead structure according to claim 13 wherein each said lead has a pivot arrangment situated at its stem end adjacent said common mounting strip.

21. A lead structure according to claim 13 wherein each said lead has a pivot arrangement intermediate said stem end and said terminal end.

22. A lead structure according to claim 15 wherein each said lead has a pivot arrangement between said bowed configuration and said terminal end.

23. A solderable lead structure according to claim 13 wherein said free terminal end of each of said leads includes an arrangement adapted for carrying a solder mass.

24. A solderable lead structure according to claim 23 wherein each said solder-carrying arrangement is constructed and arranged for locating each said solder mass in direct contact with a respective conductive area on said substrate to which it is to be attached.

25. A solderable lead structure according to claim 24 wherein said solder-carrying arrangement is constructed and arranged for locating the said solder-carrying area of said lead in the vicinity of a respective conductive area on said substrate to which it is to be attached.

26. A solderable lead structure according to claim 23 wherein said solder-carrying arrangement comprises opposing tab means for holding a solder mass in a desired disposition on said lead.

27. A lead structure according to claim 13 wherein each of said leads includes a score line between said stem end and said terminal end along which said lead may be severed subsequent to attachment of said lead structure to said substrate.

28. A lead structure according to claim 13 wherein respective leads of said two sets of leads are disposed in aligned overlying relation.

29. A lead structure as in claim 13 wherein the respective leads of said two sets of leads are in alternating interleaved relation.

30. A lead structure according to claim 13 wherein at least some of said free terminal ends include a prong projecting from the body of said lead and adapted for aligned registration with the contact area on the substrate to which such structure is to be attached.

31. A solderable lead structure according to claim 30 wherein a solder mass is carried at the terminal end of each of said leads.

32. A solderable lead structure as in claim 13 adapted for attachment to a substrate wherein:
said leads are arranged in two sets, the leads of one set overlying respective leads of the other set,
each of said leads including a bowed portion and a configuration providing a fulcrum between the terminal end and stem of each lead.
the fulcrums of one lead set being opposed to and contacting the respective fulcrums of the other lead set,
said bowed portions of the leads of one set being opposed to and bowed oppositely from the bowed portions of the respective leads of the other set,
said bowed portions being adapted to have a force applied thereto for causing one set of said leads to move in a first direction relative to said fulcrums and the other set of said leads to move in an opposite direction relative to their corresponding fulcrums, such that the free terminal ends of said first set of leads may be separated from said second set of leads.

33. A solderable lead structure according to claim 32 including means located at terminal end of at least some of said leads adapted for holding a solder mass in place at said terminal end.

34. A solderable lead structure adapted to be attached to a substrate having one or more conductive areas, comprising:
a main body portion of conductive material having a substantially comb-like configuration including a row of substantially parallel elongated leads, each having a lead body with a stem end and a free terminal end, and
a common mounting strip for carrying said leads at their said stem ends;
said free terminal end of each of said leads comprising an arrangement adapted for carrying a solder mass for use in electrically connecting said lead to a conductive area of said substrate;
said leads comprising a first set of leads and a second set of leads disposed in interleaved relation for a scissor-like movement relative to one another for enabling said free terminal ends of said leads to be separated to an open position to accept the edge of the substrate to which said structure is to be attached;
at least some of said leads including a protruding area adapted to respond to a force applied thereto to cause one set of said leads to move in a desired direction relative to the other set of leads before association with a substrate.

* * * * *